United States Patent [19]

Amir

[11] Patent Number: 4,590,457

[45] Date of Patent: May 20, 1986

[54] DIGITAL TO ANALOG CONVERTER UTILIZING PULSE WIDTH MODULATION

[75] Inventor: Gideon Amir, San Jose, Calif.

[73] Assignee: American Microsystems, Inc., Santa Clara, Calif.

[21] Appl. No.: 563,720

[22] Filed: Dec. 20, 1983

[51] Int. Cl.[4] ............................................. H03K 13/04
[52] U.S. Cl. ........................ 340/347 DA; 340/347 M
[58] Field of Search ................................. 340/347 DA

[56] References Cited

U.S. PATENT DOCUMENTS

| | | | |
|---|---|---|---|
| 4,209,775 | 6/1980 | Kawashima et al. | 340/347 DA |
| 4,233,591 | 11/1980 | Murata et al. | 340/347 DA |
| 4,400,692 | 8/1983 | Klein | 340/347 DA |
| 4,467,319 | 8/1984 | Uchikoshi | 340/347 DA |
| 4,503,421 | 3/1985 | Hareyama et al. | 340/347 DA |

*Primary Examiner*—William M. Shoop, Jr.
*Assistant Examiner*—Sharon D. Logan
*Attorney, Agent, or Firm*—Steven F. Caserza; Terrence E. Dooher; Eppa Hite

[57] ABSTRACT

A pulse width digital to analog converter is constructed which provides an output clock rate that is a multiple of the input sampling rate. In one embodiment a latch is used to store N-bit digital word representing the analog signal value to be generated. (N−K) of the most significant bits are stored in a counter which decrements its count in response to a clock signal. A plurality of least significant bits of said digital word stored in said latch are applied to a logic circuit. A ring counter is utilized to indicate which section of the output signal is currently being generated. The plurality of the least significant bits of the digital word stored in the latch, together with the output signals from the ring counter, are applied to said logic circuit, and the transition of the output signal of the digital to analog converter from a logical one to a logical zero is delayed, when required, to provide a slightly increased output pulse width in response to said plurality of least significant bits of said digital word, thereby maintaining or even increasing the resolution of the system.

18 Claims, 5 Drawing Figures

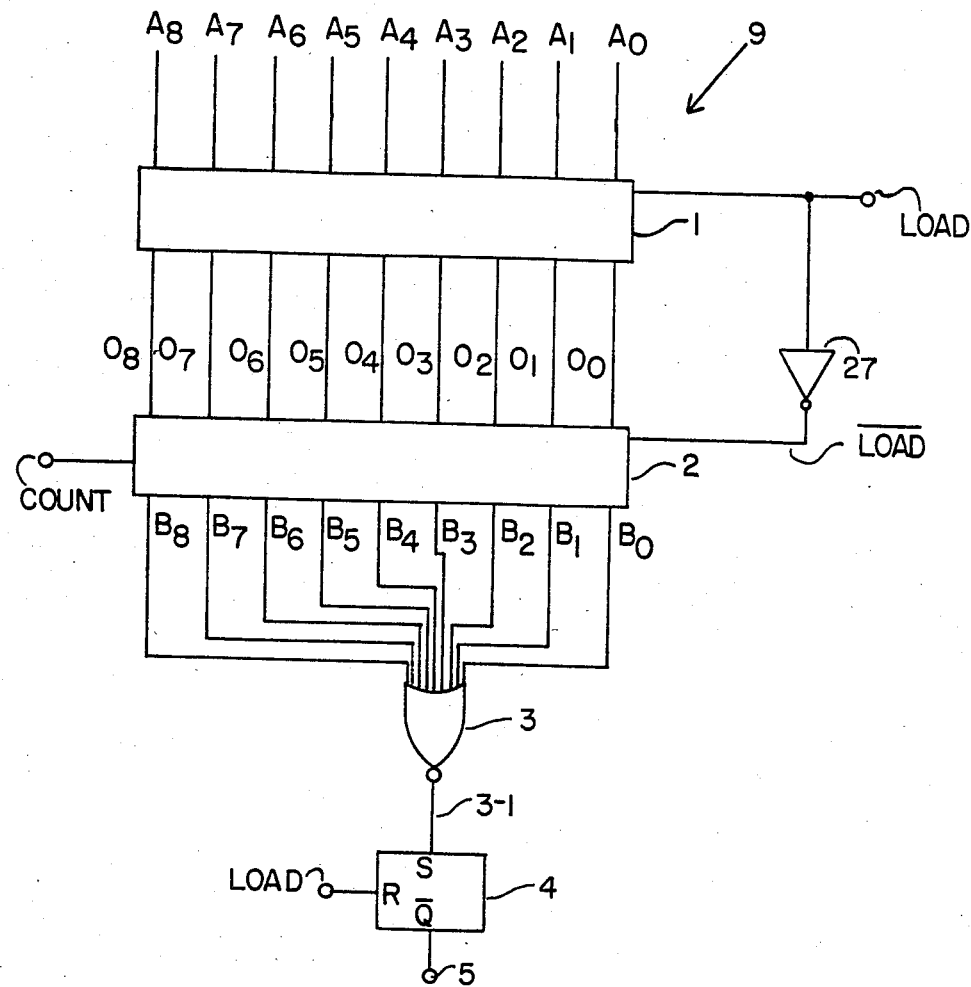
FIG. 1a
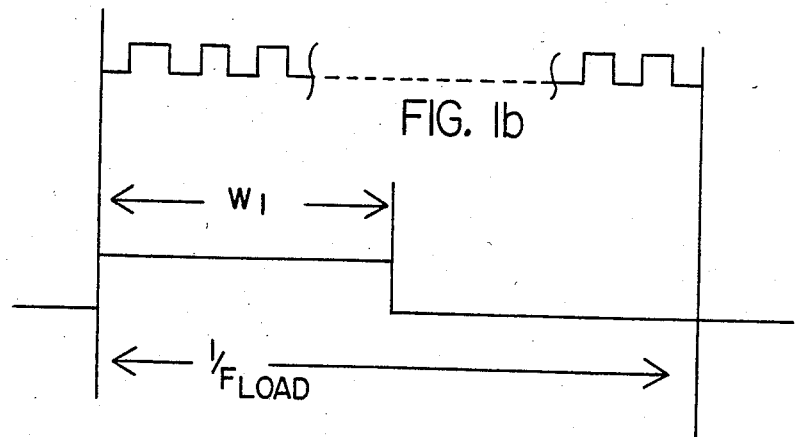
FIG. 1b
FIG. 1c

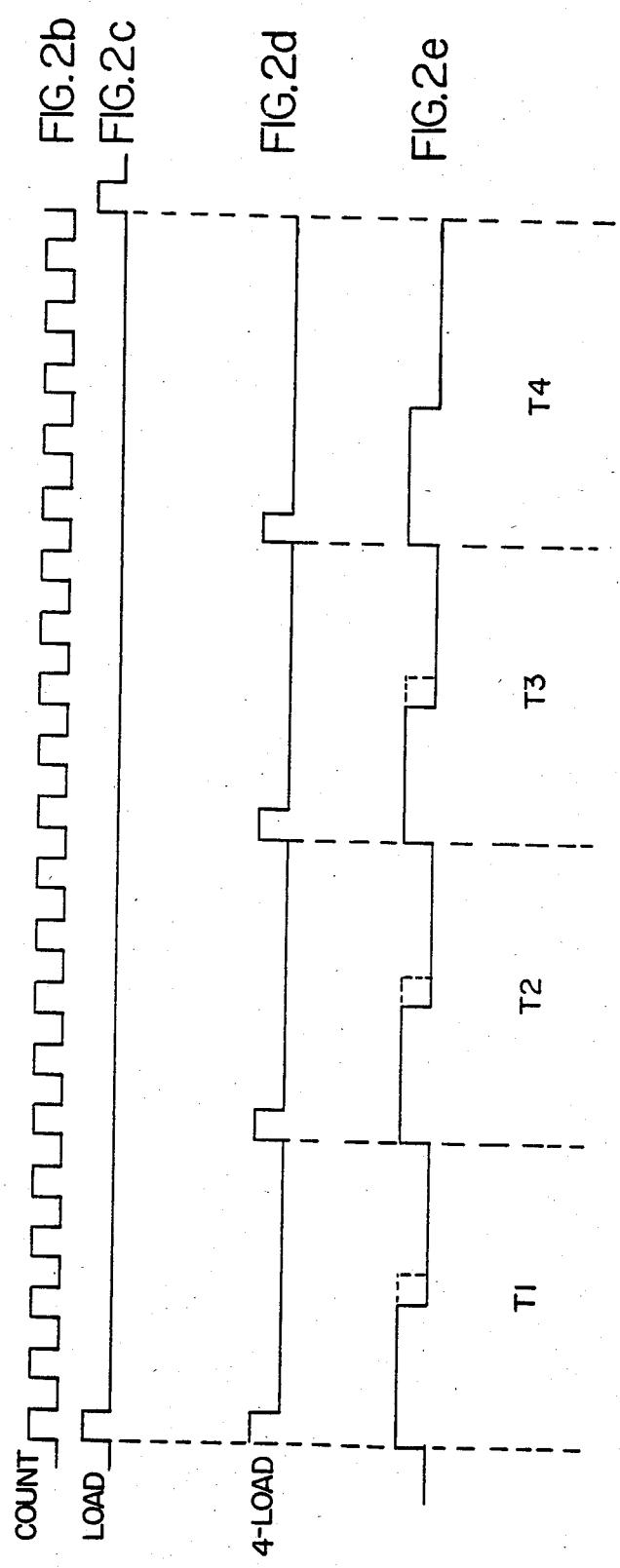

DIGITAL TO ANALOG CONVERTER UTILIZING PULSE WIDTH MODULATION

BACKGROUND OF THE INVENTION

1. Field of the Invention

This invention relates to digital to analog converters, and more particularly to digital to analog converters which utilize a pulse width modulation or other averaging technique.

2. Description of the Prior Art

Digital to analog converters, including digital to analog converters utilizing pulse width modulation techniques, are well known in the prior art. One such pulse width modulation digital to analog (D/A) converter is shown in the schematic diagram of FIG. 1a. Digital to analog converter 9 includes latch 1 which is capable of storing a digital word containing a plurality of binary digits (bits). Digital to analog converter 9 also includes binary counter 2. In the embodiment shown in FIG. 1a, the latch 1 and binary counter 2 are nine bits wide. In other words, latch 1 is capable of receiving a binary input word formed of a plurality of nine bits A0 through A8.

During the operation of the prior art digital to analog converter 9 of FIG. 1a, a nine bit binary signal A0 through A8 is applied to the input leads of latch 1. A high LOAD signal is applied to the load input lead of latch 1, thus storing bits A0 through A8 in latch 1. These bits A0 through A8 form a nine bit word which define the digital representation of the analog voltage to be generated. This nine bit word is available as output bits 00 through 08 from latch 1. These bits 00 through 08 are loaded into counter 2 on the positive going transition of the $\overline{\text{LOAD}}$ signal, thus presetting the count of counter 2 to the nine bit binary word representing the analog voltage to be generated. This high signal $\overline{\text{LOAD}}$ is generated on the negative going transition of the LOAD signal which is connected to the load input lead of Counter 2 via inverter 27.

Upon each positive transition of a clock signal COUNT (shown in FIG. 1b) applied to the COUNT input lead of counter 2, the count provided by counter 2 is decremented by one until a count of 000000000 is reached. When a count of 000000000 is stored in counter 2, the count remains fixed at 000000000, even upon receipt of further positive going COUNT clock signals. The count of counter 2 is provided as output signals B0 through B8 which are applied to the input leads of NOR gate 3, which generates on its output lead 3-1 a signal which is a logical one only when the binary counter B0 through B8 provided by counter 2 is equal to 000000000. For all other counts B0 through B8 of counter 2, the output signal on lead 3-1 will be a logical zero. The output signal from NOR gate 3 is applied to the SET input lead of RS flip flop 4. RS flip flop 4 is reset on the positive going edge of the LOAD clock signal (applied to the RESET input lead of flip flop 4) such that its output signal $\overline{Q}$ is a logical one. Similarly, RS flip flop 4 is set upon receipt of a positive going signal on lead 3-1 such that the output signal $\overline{Q}$ from flip flop 4 is a logical zero. Accordingly, at the beginning of the digital to analog conversion process, when a nine bit binary word representing the analog voltage to be generated is stored in latch 1, RS flip flop 4 is reset such that its output signal $\overline{Q}$ is high (logical 1). Upon each pulse of clock signal COUNT the count of counter 2 is decremented by one. After a given number of COUNT clock cycles, the count of counter 2 is 000000000, at which time the output signal available on lead 3-1 of NOR gate 3 is equal to a logical one, thus setting the $\overline{Q}$ output signal of flip flop 4 to a logical zero. The output signal $\overline{Q}$ of RS flip flop 4 is shown in FIG. 1c. As shown in FIG. 1c, the period of one digital to analog conversion operation is equal to the reciprocal of the frequency $F_{LOAD}$ of clock signal LOAD. Similarly, the time during which the $\overline{Q}$ output signal from flip flop 4 is a logical one is shown as time W1. This time W1 is dependent on the initial binary word A0 through A8 stored in latch 1 which represents the analog voltage to be generated. Thus, when a relatively high analog voltage is to be generated, a relatively large binary word A0 through A8 will be stored in latch 1, thus causing a relatively large number of COUNT clock pulses to decrement the count of counter 2 to a value of 000000000, thereby providing a relatively large time W1 during which the output signal $\overline{Q}$ of flip flop 4 is high. Conversely, if a relatively small analog voltage is to be generated, a relatively small binary word A0 through A8 will be loaded into latch 1, thus causing a relatively few COUNT clock pulses to cause the count of counter 2 to decrement to 000000000, thereby providing a relatively small time W1 during which the output signal $\overline{Q}$ of flip flop 4 is high.

In one embodiment as shown in FIG. 1a, the frequency $F_{COUNT}$ is equal to $2^9$ times the frequency $F_{LOAD}$, when the binary word A0 through A8 is comprised of nine bits. To state this relationship more generally, for an N bit binary input word, $$F_{COUNT} = 2^N F_{LOAD},$$

where $F_{COUNT}$ = the frequency of the clock signal applied to the COUNT input lead of counter 2, and $F_{LOAD}$ = the frequency of the clock signal applied to the LOAD input lead of latch 1 and to the RESET lead of flip flop 4.

To provide greater resolution in the generated analog signal, a greater number of bits must be used to define the analog voltage to be generated, and thus latch 1, counter 2 and NOR gate 3 must be capable of performing their operations on this greater number of bits. For example, in order to provide a digital to analog converter having twice the resolution of the nine bit digital analog converter of FIG. 1a, a ten bit digital to analog converter must be provided wherein latch 1 is capable of receiving and storing a ten bit word representing the analog voltage to be converted, counter 2 is capable of being preset to the ten bit word stored by latch 1, and NOR gate 3 is capable of performing a NOR operation on the ten output bits from counter 2. Naturally, for a ten bit digital to analog converter, the frequency of $F_{COUNT} = 2^{10} F_{LOAD}$. While it appears rather straightforward to increase the resolution of a digital to analog converter by providing that the digital to analog converter is capable of handling the required number of bits, the frequency of the COUNT signal limits the extent to which this can be done. For example, in many typical digital to analog converter applications, the frequency of the LOAD signal is required to be on the order of 10 Kilohertz, thus allowing 10,000 digital to analog conversions per second. This large number of digital to analog conversions is required in order to generate an analog signal which varies rather rapidly with time. Thus, for a LOAD signal with a frequency of 10 KHz, the resolution of the DAC is limited to nine bits since $2^9 \cdot 10 \text{ KHZ} = 5.12 \text{ MHZ}$. It is well known that by utilizing a sampling frequency $F_{LOAD}$, the output signal will contain a noise component of frequency $F_{LOAD}$ and its harmonics. When utilizing $F_{LOAD} = 10$ KHz, the result is a very strong 10 Kilohertz noise component. In order to eliminate this 10 Kilohertz noise component and its harmonics, a significant amount of filtering is required. Furthermore, if it is desirable to retain the signal components near 5 Kilohertz, a very selective notch filter is required. Such filters are capable of being manufactured using well known principles, although it will be appreciated by those of ordinary skill in the art that such filters may require a large number of stages, a large number of components, and thus increased cost and device complexity. Another method for reducing the undesirable effect of sampling noise is to increase the frequency of the LOAD signal to a point where sample noise is not within the frequency band of interest. Thus, for example, in a digital to analog converter whose output signal is in the human audible range rather than using an $F_{LOAD}$ equal to 10 KHz, the converter can be constructed wherein $F_{LOAD}$ equals 40 KHz, thereby providing an output noise component of 40 KHz, and its harmonics well beyond the hearing range of most humans.

It is often desirable to implement a digital to analog converter as a monolithic integrated circuit device formed on a single piece of semiconductor material, and often as a subsystem of a much larger system formed on a single piece of semiconductor material. Many semiconductor circuits cannot operate at a frequency much greater than about 5 MHz. Thus, for a digital to analog converter capable of providing approximately 40,000 digital to analog conversions per second, the resolution is limited to approximately seven bits in that, for a seven bit resolution, the frequency $F_{COUNT} = 2^7$ $F_{LOAD} = (128)(40 \text{ KHz}) = 5.12 \text{ MHz}$. Thus, such prior art digital to analog converters are limited as to their resolution, or as to their repetition frequency (i.e. the number of digital to analog conversions per second). For a given operating speed, if a higher resolution is desired, the repetition frequency must decrease, thereby requiring additional filtering of the analog voltage which is generated and providing a more poorly defined analog output signal due to the lower sampling rate.

Another type of prior art digital to analog converter utilizing a pulse width technique is described in U.S. Pat. No. 4,117,476 issued Sept. 26, 1978 on an invention of Koyanagi. Koyanagi utilizes a plurality of flip flops and logical gates to implement a pulse width digital to analog converter.

Of importance, in these prior art digital to analog converters, the output signal contains a noise component at the frequency of the input sampling rate and its harmonics.

SUMMARY

In accordance with the teachings of this invention, a pulse width digital to analog converter is constructed utilizing a unique design which provides an output clock rate that is a multiple of the input sampling rate while maintaining or even improving the resolution, as compared with prior art pulse width digital to analog converters. In this manner, for a given digital to analog sample conversion repetition rate, the same or greater resolution is provided as compared with prior art pulse width digital to analog converters while increasing the output clock rate and thus increasing the frequency of the output noise signal due to sampling.

In one embodiment of this invention, a latch is used to store the input digital word representing the analog signal to be generated. In each of multiple sample clock subperiods, a plurality of most significant bits from said latch are loaded into a counter which decrements its count to zero in response to a clock signal. A plurality of least significant bits of said digital word stored in said latch are applied to a logic circuit. A ring counter is utilized to indicate which subperiod of the output signal is currently being generated. The plurality of the least significant bits of the digital word stored in the latch, together with the output signals from the ring counter, are applied to said logic circuit, and the transition of the output signal of the digital to analog converter from a logical one to a logical zero is delayed, when required, to provide a slightly increased output pulse width in response to said plurality of least significant bits of said digital word, thereby maintaining or even increasing the resolution of the system.

BRIEF DESCRIPTION OF THE DRAWINGS

FIG. 1a is a schematic diagram of a typical prior art pulse width modulation digital to analog converter;

FIG. 1b is a graphical representation of the clock signal COUNT utilized by the structure of FIG. 1a;

FIG. 1c is a graphical representation of the output signal provided by the structure of FIG. 1a;

FIG. 2b is a graphical representation of the clock signal COUNT used in the structure of FIG. 2a;

FIG. 2c is a graphical representation of the clock signal LOAD used in the structure of FIG. 2a;

FIG. 2d is a graphical representation of the output clock signal 4-Load used in the structure of FIG. 2a; and FIG. 2e is a graphical representation of the output signal provided by the structure of FIG. 2a.

DETAILED DESCRIPTION

Figure 2A:
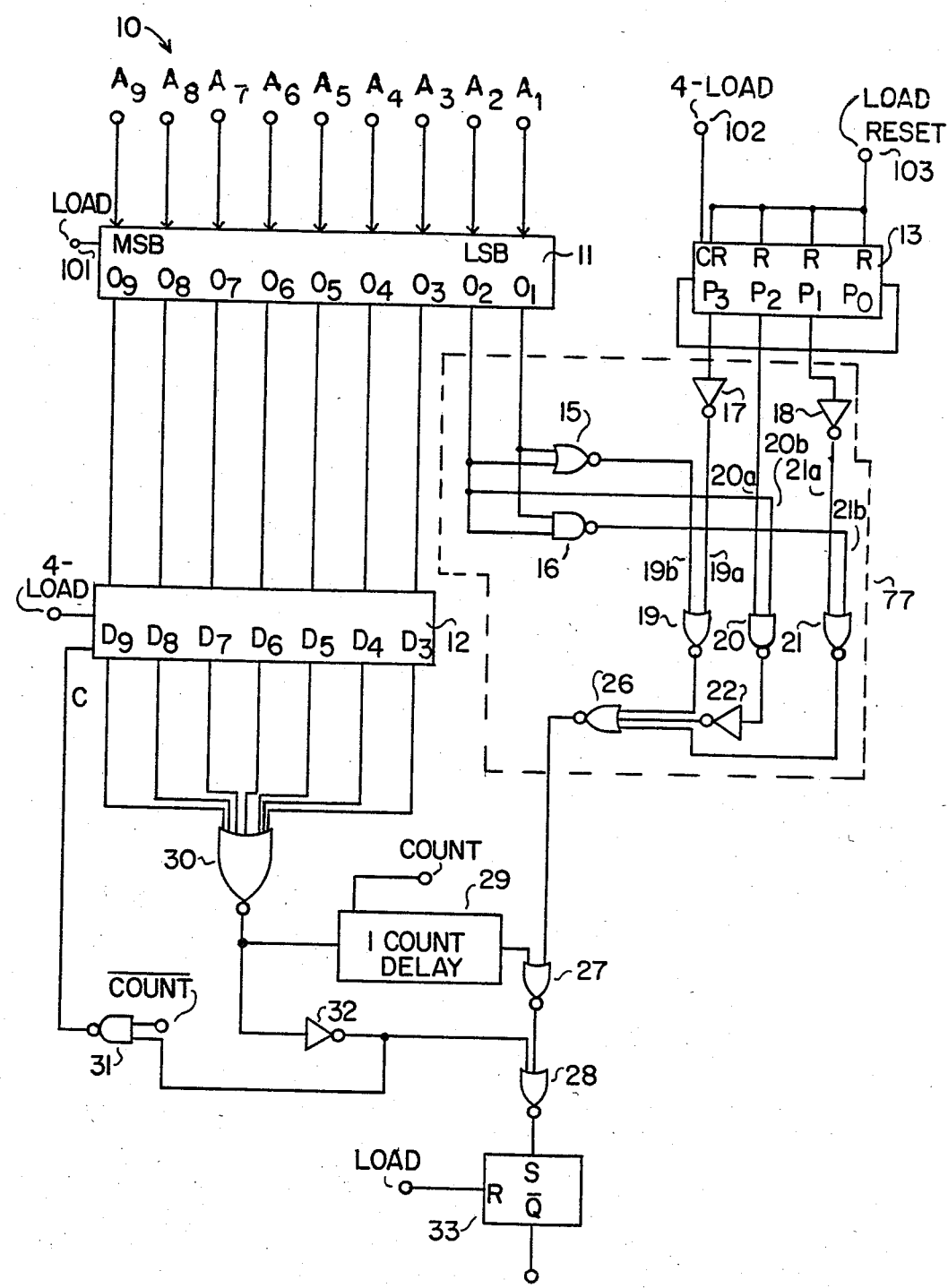
FIG. 2a is a schematic diagram of one embodiment of a pulse width modulation digital to analog converter constructed in accordance with this invention.

FIG. 2a is a schematic diagram depicting one embodiment of my invention. Pulse width digital to analog converter 10 of FIG. 2a is shown as a nine bit digital to analog converter. Naturally, other embodiments of this invention can be constructed to operate on other than nine bit words. Digital to analog converter (DAC) 10 includes nine bit latch 11 which, upon application of a clock signal SAMPLE or LOAD (shown in FIG. 2c) receives and stores nine bits A1 through A9 of a digital input word which represents the desired analog output voltage. Latch 11 stores this nine bit ("first") word during the entire sampling period, until a subsequent nine bit word is stored in latch 11 in response to the next LOAD signal. A second output clock signal RELOAD or 4-LOAD (shown in FIG. 2d) having four times the frequency of the clock signal LOAD is applied to the input lead of counter 12 and causes the seven most significant bits 03 through 09 ("second" word) to be loaded into down counter 12 from latch 11. The N (nine) bit first word is in effect divided by $K^2$ (four), to produce an N−K (seven) bit second word, with a K (two) bit remainder. The N−K (seven) bit value is reloaded and recounted $K^2$ (four) times, and the value of the remainder is added back, one unit to a recount, to produce $K^2$ (four) output pulses of a total duration equal to the N (nine) bit value times the count clock period P.

The signals LOAD and 4-LOAD are synchronized so that a rising edge of LOAD always coincides with a rising edge of 4-LOAD.

Once the seven most significant bits D3 through D9 are loaded into counter 12, counter 12 decrements its count by one in response to each COUNT signal (shown in FIG. 2b), ultimately causing the count stored in counter 12 to be equal to 0000000. In this embodiment, the frequency $F_{COUNT}=2^9 \, F_{LOAD}$. The output signals D3 through D9 from counter 12 are applied to the input leads of NOR gate 30. NOR gate 30 provides a logical one output signal when the count stored within counter 12 has been decremented to 0000000, and provides an output signal of logical zero at all other times. Inverter 32, therefore, provides a logical zero output signal when the count D3 through D9 stored within counter 12 has been decremented to 0000000, and provides a logical one output signal at all other times. Thus, because the output signal from inverter 32 is applied to one input lead of NOR gate 28, the output signal from NOR gate 28, is a logical zero at least until the count stored within counter 12 has not been decremented to 0000000. The output signal from NOR gate 28 is applied to the S input lead of RS flip flop 33, and thus causes the $\bar{Q}$ signal of flip flop 33 to become a logical zero when the output signal from NOR gate 28 becomes a logical one. The $\bar{Q}$ signal remains a logical zero until the end of the subperiod T. The reload signal which reloads counter 12 also resets flip-flop 33 to output a high $\bar{Q}$ signal.

As soon as counter 12 is reloaded upon receipt of the next 4-LOAD signal, it decrements its count by 1 in response to each COUNT signal as described above. Thus, the number represented by the seven most significant bits D3 through D9 in counter 2 is counted down to zero four times during each period of the LOAD signal.

In contrast to prior art DAC's in which the input sample frequency is identical to the output clock frequency, the present invention utilizes an output clock frequency reload which is a multiple (in this example, 4) of the input sample frequency. In this manner, the noise component of the analog output signal due to the output clock frequency is increased in frequency as compared with prior art DAC's having the same input sample frequency and resolution, thereby moving the frequency of the noise component further away from the frequency band of interest. In one embodiment, the DAC of this invention is used to generate analog audio signals, and the noise component due to the sampling frequency is increased in frequency above the range of human hearing, thereby eliminating or at least minimizing the filtering requirements necessary to remove the noise component of the output signal.

The two least significant bits 02 and 01 stored in latch 11, ring counter 13, and full-period extension decision circuitry 77 operate in unison in order to determine whether the output signal from NOR gate 27 is to remain a logical one for one COUNT clock period after the complete decrementation of the count stored within counter 12 to a value of 0000000 in each of four output clock time periods T1 through T4 (determined by the 4-LOAD signal) associated with a input signal sample time period. The four consecutive time periods T1 through T4 divide the input sample period into four equal parts. In this manner, by allowing the output signal to remain a logical one for an additional single period of the COUNT signal in a selected number 0, 1, 2, or 3 of time periods T1 through T3, (as shown in FIG. 2e) the resolution of the novel DAC of this invention is equal to the resolution of prior art DAC's which utilize a lower output clock frequency.

Four bit ring counter 13 provides four output bits P0 through P3 reflecting the current time period T1 through T4 of the current input sample period. In this embodiment output bit P0 is not used. Ring counter 13 is reset upon receipt of a LOAD signal at its reset terminal 103 such that P3 is a logical one, and P0 through P2 are logical zeros. Ring counter 13 then shifts the logical one one bit to the right in response to receipt of each 4-LOAD signal (having a frequency equal to four times $F_{LOAD}$) at its count terminal 102.

Referring to Table 1, the truth table representing the output signal provided by NOR gate 26 of full period extension decision circuitry 77 as a function of input signals 01, 02, and time periods T1 through T4 is shown. For example, with the two least significant bits 01 and 02 both equal to zero, no extension of the trailing edge of the output signals provided during time periods T1 through T4 is desired. Similarly, when 02 is zero and 01 is one, a single extension during time period T1 is desired; when 02 is 1 and 01 is zero, two extensions (during time periods T1 and T2 ) are desired; and when 02 and 01 are both one, three extensions are desired, one each in time periods T1, T2, and T3.

The output signal from NOR gate 26 represents whether a full count period extension is required during the time periods T1 through T4. NOR gate 26 provides a logical zero output signal when a full period extension is required, and provides a logical one output signal when a full period extension is not required. The output signal is applied to one input lead of NOR gate 27 whose other input lead is connected to one COUNT delay means 29, which provides a logical one output signal one COUNT period after the output signal from NOR gate 30 becomes a logical one in response to the complete decrementation of the count stored within counter 12. Thus, if the output signal from NOR gate 26 is a logical zero and the output signal from delay means 29 is a logical zero, NOR gate 27 will provide a logical one output signal applied to one input lead of NOR gate 28, thereby causing the output lead of NOR gate 28 to remain a logical zero, and prevent the setting of RS flip flop 33. Thus, even after the complete decrementation of the count within counter 12, upon which the output signal from inverter 32 becomes a logical zero, the output signal from NOR gate 27 remains a logical one for one COUNT period if full period extension decision logic 77 provides a logical one signal on an input to NOR gate 26, thereby indicating that an extension is required. After that one COUNT period, the output signal from delay means 29 becomes a logical one, thereby causing NOR gate 27 to provide a logical zero output signal, which does not keep the output signal from NOR gate 28 from becoming a logical one.

In general, following the above teaching, a positive N bit word is stored in a latch in response to a LOAD signal having frequency $F_{LOAD}$ and period p. The most significant (N−K) bits of the N bit word are loaded into a counter in response to a second load (reload) signal having a frequency of $2^K \times F_{LOAD}$, where N and K are positive integers. The (N−K) bit word is decremented by one (until it becomes zero) in response to a count clock signal having a frequency of $2^N \times F_{LOAD}$ so that the (N−K) bit word is decremented to zero $2^K$ times in each period P.

A ring counter having $2^K$ output signals operates together with the full-period extension decision circuitry and the one count delay means to hold the output signal of the digital to analog converter high for an additional count clock period in each sample period P the first J times the N−K bit word is decremented to zero, where J is the value of the K bit word consisting of the K least significant bits of the N bit word.

Figure 2F:
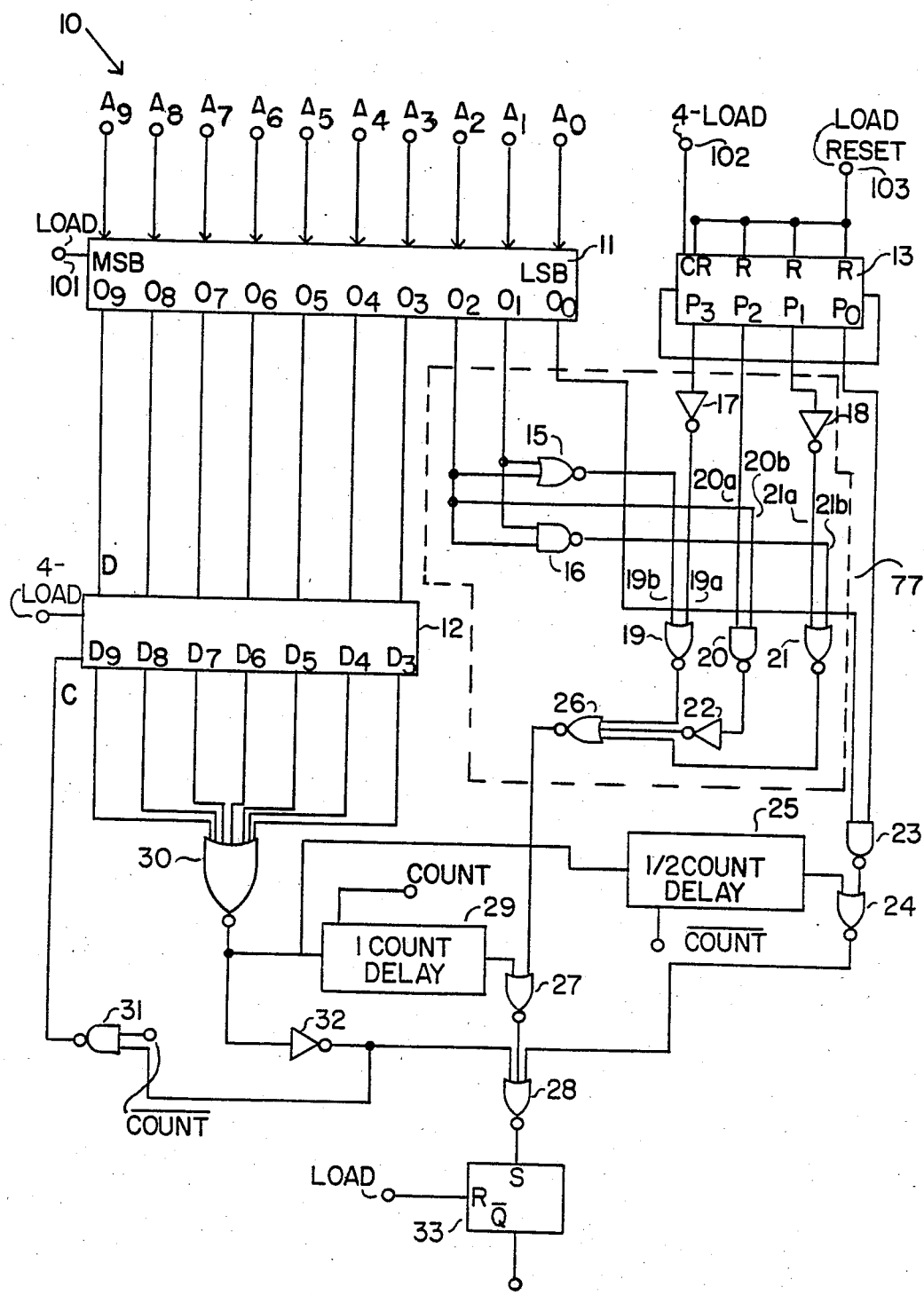
FIG. 2f is a schematic diagram of one embodiment of a pulse width modulation digital to analog converter having additional one bit resolution constructed in accordance with this invention.

In another embodiment of this invention, as shown in FIG. 2f, an additional means is provided for providing additional one bit resolution without increasing $F_{COUNT}$, the frequency of the COUNT signal. In this case, a 10 bit word A0, A1,—A9 is stored in latch 11 on the rising edge of the LOAD signal and the seven most significant bits 03 through 09 and the second and third least significant bits 01 and 02 are treated as described in the first embodiment described above. The least significant bit 00 is used together with output signal P0 from ring counter 13 to provide the input signals to NAND gate 23, which serves as the one-half period extension logic. As shown in Table 2, NAND gate 23 will provide a logical zero output signal if and only if the least significant bit 00 is a logical one and signal P0 from ring counter 13 is a logical one, indicating time period T4. In this event, the output signal from NOR gate 24 is determined by the output signal from one-half COUNT delay means 25, which serves as the second input signal to NOR gate 24. Delay means 25 provides an output signal of a logical zero during the first one-half COUNT period after the output signal from NOR gate 30 becomes a logical one indicating that the count stored within counter 12 has been completely decremented to 0000000, thus causing the output signal from NOR gate 24 to be a logical one, thus allowing NOR gate 28 to continue providing a logical zero output signal. One-half COUNT period later, however, the output signal from delay means 25 is a logical one, thus causing NOR gate 24 to provide a logical zero output signal, thereby causing NOR gate 28 to provide a logical one output signal. This, in effect, allows, during time period T4, an additional one-half COUNT period extension of the output pulse.

In one embodiment of my invention one COUNT delay means 29 (FIG. 2a) comprises a flip flop, such as a D type flip flop well known to those who are skilled in the art. When a D type flip flop is used as one COUNT delay means 29, its D input lead is connected to the signal to be delayed provided on the output lead of NOR gate 30, its Q output signal provides the delayed signal, and the D type flip flop is controlled by a suitable clock such as COUNT.

Similarly, in one embodiment of my invention, one-half COUNT delay means 25 also comprises a flip flop, such as a D type flip flop. When a D type flip flop is used as the one-half COUNT delay means 25, its D input lead is connected to receive the signal to be delayed by one-half COUNT (i.e., the signal provided on the output lead of NOR gate 30), and its Q output lead provides the delayed signal. The D type flip flop is controlled by a suitable clock signal, such as by COUNT.

In general, following the above teaching, a positive N bit word is stored in a latch in response to a LOAD signal having a frequency $F_{LOAD}$ and period P, where N is a positive integer.

The first (N−K) most significant bits of the N bit word are loaded into a counter in response to a second load signal having a frequency of $2^{K-1} \times F_{LOAD}$.

The (N−K) bit word is decremented by one (until it becomes zero) in response to a clock signal having a frequency of $2^{N-1} \times F_{LOAD}$, so that the (N−K) bit word is decremented to zero $2^{K-1}$ times in each period P.

A ring counter having $2^{K-1}$ output signals operates together with the full-period extension decision circuitry, the one count delay means and the one-half count delay means to hold the output signal of the digital to analog converter high for an additional clock period the first J times the N−K bit word is decremented to zero, where J is the value of the word consisting of the (K−1) most significant bits of the K least significant bits of the N bit word and to hold the output signal high for an additional one-half clock period in each period P when the least significant bit of said first digital word is one.

In another embodiment, an N bit digital word is stored in a latch in response to a first load signal having a frequency of $F_{LOAD}$.

Then the N bit word is stored in a counter in response to a second load signal having frequency $M \times F_{LOAD}$ where M is a positive integer greater than or equal to 2.

The N bit word in the counter is then decremented by one (until it becomes zero) in response to each pulse of a clock signal having a frequency of $M \times 2^N \times F_{LOAD}$ where M is a positive integer greater than one, so that the N bit word is decremented to zero M times in each period P.

The output signal of the digital to analog converter is high when the word in the counter is positive and low when the decremented number stored in the counter is zero. In this manner the output clock rate is a multiple of the input sampling rate.

The above embodiments are intended to be exemplary and not limiting and many substitutions and modifications may be made therein by one of ordinary skill in the art without departing from the spirit and scope of the invention.

TABLE 1

| Decimal Value | 02 | 01 | P3 | P2 | P1 | P0 | Period | 19a | 19b | 20a | 20b | 21a | 21b | 20 | 22 | 19 | 21 | 26 | Extension? | Value |
|---|---|---|---|---|---|---|---|---|---|---|---|---|---|---|---|---|---|---|---|---|
| 0 | 0 | 0 | 1 | 0 | 0 | 0 | T1 | 0 | 1 | 0 | 0 | 1 | 1 | 1 | 0 | 0 | 0 | 1 | No | 0 |
|   | 0 | 0 | 0 | 1 | 0 | 0 | T2 | 1 | 1 | 1 | 0 | 1 | 1 | 1 | 0 | 0 | 0 | 1 | No |   |
|   | 0 | 0 | 0 | 0 | 1 | 0 | T3 | 1 | 1 | 0 | 0 | 0 | 1 | 1 | 0 | 0 | 0 | 1 | No |   |
|   | 0 | 0 | 0 | 0 | 0 | 1 | T4 | 1 | 1 | 0 | 0 | 0 | 1 | 1 | 0 | 0 | 0 | 1 | No |   |
| 1 | 0 | 1 | 1 | 0 | 0 | 0 | T1 | 0 | 0 | 0 | 0 | 1 | 1 | 1 | 0 | 1 | 0 | 0 | Yes | 1 |
|   | 0 | 1 | 0 | 1 | 0 | 0 | T2 | 1 | 0 | 1 | 0 | 1 | 1 | 1 | 0 | 0 | 0 | 1 | No |   |
|   | 0 | 1 | 0 | 0 | 1 | 0 | T3 | 1 | 0 | 0 | 0 | 0 | 1 | 1 | 0 | 0 | 0 | 1 | No |   |
|   | 0 | 1 | 0 | 0 | 0 | 1 | T4 | 1 | 0 | 0 | 0 | 1 | 1 | 1 | 0 | 0 | 0 | 1 | No |   |
| 2 | 1 | 0 | 1 | 0 | 0 | 0 | T1 | 0 | 0 | 0 | 1 | 1 | 1 | 1 | 0 | 1 | 0 | 0 | Yes | 2 |

TABLE 1-continued

| Decimal Value | 02 | 01 | P3 | P2 | P1 | P0 | Period | 19a | 19b | 20a | 20b | 21a | 21b | 20 | 22 | 19 | 21 | 26 | Extension? | Value |
|---|---|---|---|---|---|---|---|---|---|---|---|---|---|---|---|---|---|---|---|---|
|  | 1 | 0 | 0 | 1 | 0 | 0 | T2 | 1 | 0 | 1 | 1 | 1 | 0 | 1 | 0 | 0 | 0 |  | Yes |  |
|  | 1 | 0 | 0 | 0 | 1 | 0 | T3 | 1 | 0 | 0 | 1 | 0 | 1 | 1 | 0 | 0 | 0 | 1 | No |  |
|  | 1 | 0 | 0 | 0 | 0 | 1 | T4 | 1 | 0 | 0 | 1 | 1 | 1 | 1 | 0 | 0 | 0 | 1 | No |  |
| 3 | 1 | 1 | 1 | 0 | 0 | 0 | T1 | 0 | 0 | 0 | 1 | 1 | 0 | 1 | 0 | 1 | 0 | 0 | Yes | 3 |
|  | 1 | 1 | 0 | 1 | 0 | 0 | T2 | 1 | 0 | 1 | 1 | 1 | 0 | 0 | 1 | 0 | 0 | 0 | Yes |  |
|  | 1 | 1 | 0 | 0 | 1 | 0 | T3 | 1 | 0 | 0 | 1 | 0 | 0 | 1 | 0 | 0 | 1 | 0 | Yes |  |
|  | 1 | 1 | 0 | 0 | 0 | 1 | T4 | 1 | 0 | 0 | 1 | 1 | 0 | 1 | 0 | 0 | 0 | 1 | No |  |

TABLE 2

| Decimal Value | 00 | P0 | 23 | Extension |
|---|---|---|---|---|
| 0 | 0 | 0 | 1 | No |
| 0 | 0 | 1 | 1 | No |
| 1 | 1 | 0 | 1 | No |
| 1 | 1 | 1 | 0 | Yes |

I claim:

1. A digital-to-analog converter comprising:

N input terminals for receiving respective bits of an N bit digital word made up of K least significant bits and N−K most significant bits, and representing a sample of an analog signal to be generated;

a source of a sample clock signal at frequency $f_s$ and having period P;

input memory means responsive to the sample clock signal to store the values at the N input terminals as a first digital word;

a source of a reload clock signal at frequency $f_r = (2^K)f_s$ and synchronized with the sample clock signal;

a source of a count clock at frequency $f_c = (2^N)f_s$ and synchronized with the sample clock;

a down counter responsive to the reload clock signal to copy the N−K most significant bit values from the input memory as a second digital word and responsive to the count clock signal to decrement the second digital word by ones to zero, and having N−K output terminals at which the second digital word values are output; and means for producing an output signal having a first level while the second digital word is positive and continuing to have the first level during one period of the count clock after the second word is decremented to zero in each of J periods of the reload clock per period of the sample clock, where J is the value of the K least significant bits, and otherwise having a second level.

2. Apparatus in claim 1 wherein K=2.

3. Apparatus in claim 1 wherein said means for producing an output signal comprises a ring counter.

4. Apparatus in claim 3 wherein said means for producing an output signal further comprises a one count delay means.

5. Apparatus in claim 4 wherein the J times in each period P said output signal has said first value are the first J times said decremented word is zero.

6. Apparatus in claim 2 wherein said means for producing an output signal comprises a ring counter.

7. Apparatus in claim 6 wherein said means for producing an output signal further comprises a one count delay means.

8. Apparatus in claim 7 wherein the J times in each period P said output signal has said first value are the first J times said decremented word is zero.

9. A digital-to-analog converter comprising:

N input terminals for receiving respective bits of an N bit digital word made up of K least significant bits and N−K most significant bits, and representing a sample of an analog signal to be generated;

a source of a sample clock signal at frequency $f_s$ and having period P;

input memory means responsive to the sample clock signal to store the values at the N input terminals as a first digital word;

a source of a reload clock signal at frequency $f_r = (2^{K-1})f_s$ and synchronized with the sample clock signal;

a source of a count clock at frequency $f_c = (2^{N-1})f_s$ and synchronized with the sample clock;

a down counter responsive to the reload clock signal to copy the N−K most significant bit values from the input memory as a second digital word and responsive to the count clock signal to decrement the second digital word by ones to zero, and having N−K output terminals at which the second digital word values are output; and means for producing an output signal having a first level while the second digital word is positive and continuing to have the first level during one period of the count clock after the second word is decremented to zero in each of J periods of the reload clock per period of the sample clock, where J is the value of the K−1 most significant bits of the K least significant bits, and, when the LSB=1, continuing to have the first level during one-half period of the count clock in an additional period of the reload clock per period of the sample clock, and otherwise having a second level.

10. Apparatus in claim 9 wherein K=3.

11. Apparatus in claim 9 wherein said means for producing an output signal comprises a ring counter; a one count delay means; and a one-half count delay means.

12. Apparatus in claim 11 wherein signals from said ring counter, said one count delay means, and said one-half count delay means cause said output signal to have said first value for one clock period after said decremented word is zero exactly J times in each period P and, when the least significant bit equals one, for one-half clock period exactly one additional time.

13. Apparatus in claim 12 wherein the J times in each period said output signal remains at said first value for one clock period after said decremented word is zero are the first J times said decremented word is zero and the one time said output signal has said first value for one-half clock period is the (J+1)st time said decremented word is zero.

14. Apparatus in claim 10 wherein said means for producing an output signal comprises a ring counter; a one count delay means; and a one-half count delay means.

15. Apparatus in claim 14 wherein signals from said ring counter said one count delay means and said one-half count delay means cause said output signal to have said first value for one clock period after said decremented word is zero exactly J times in each period P and for one-half clock period exactly one time.

16. Apparatus in claim 15 wherein the J times in each period said output signal remains at said first value for one clock period after said decremented word is zero are the first J times said decremented word is zero and the one time said output signal has said first value for one-half clock period is the (J+1)st time said decremented word is zero.

17. A digital-to-analog converter comprising:

N input terminals for receiving respective bits of an N bit digital word representing a sample of an analog signal to be generated;

a source of a sample clock signal at frequency $f_s$ and having period P;

input memory means responsive to the sample clock signal to store the values at the N input terminals as a first digital word;

a source of a reload clock signal at frequency $f_r = (M)f_s$ and synchronized with the sample clock signal, where M is a positive integer equal to at least 2;

a source of a count clock at frequency $f_c = (2^N)(M)f_s$ and synchronized with the sample clock;

a down counter responsive to the reload clock signal to copy the first digital word as a second digital word and responsive to the count clock signal to decrement the second digital word by ones to zero, and having N output terminals at which the second digital word values are output; and means for producing an output signal having a first level while the second digital word is positive, and otherwise having a second level.

18. A digital-to-analog converter of the type which, once per sample period at frequency $f_s$, accepts an N-bit digital sample of an analog signal to be generated, divides the N bits into a most significant (N−K) bit portion and a least significant (K) bit remainder portion;

allocates each unit of the remainder value to a respective one of $2^K$ subperiods T of the sample period, and during each of subperiods T, counts at count clock frequency $f_c = 2^N f_s$, to the (N−K) bit portion value while producing a first level output signal, plus one count if a remainder unit is allocated to that subperiod, and produces a second level output signal for the balance of that subperiod, characterized in that:

the circuit produces at most one first level output signal during each subperiod T.

* * * * *